US007001046B2

(12) United States Patent
Kaga et al.

(10) Patent No.: US 7,001,046 B2
(45) Date of Patent: Feb. 21, 2006

(54) LED LAMP

(75) Inventors: Koichi Kaga, Aichi-ken (JP); Satoru Tahata, Kanagawa-ken (JP)

(73) Assignees: Toyoda Gosei Co., Ltd., Aichi-ken (JP); E-Tech Co., Ltd., Yokohama (JP)

( * ) Notice: Subject to any disclaimer, the term of this patent is extended or adjusted under 35 U.S.C. 154(b) by 0 days.

(21) Appl. No.: 10/722,562

(22) Filed: Nov. 28, 2003

(65) Prior Publication Data

US 2004/0141337 A1 Jul. 22, 2004

(30) Foreign Application Priority Data

Nov. 29, 2002 (JP) .............................. 2002-349285

(51) Int. Cl.
*F21V 29/00* (2006.01)
(52) U.S. Cl. ...................... 362/294; 362/373; 362/545; 362/659
(58) Field of Classification Search ................ 362/555, 362/800, 226, 294, 545, 373, 659
See application file for complete search history.

(56) References Cited

U.S. PATENT DOCUMENTS

| 1,747,896 | A | * | 2/1930 | Gates ........................ 439/682 |
| 2,949,595 | A | * | 8/1960 | Doeleman ................... 338/70 |
| 3,887,803 | A | * | 6/1975 | Savage, Jr. ................. 362/363 |
| 4,033,658 | A | * | 7/1977 | Asick ......................... 439/218 |
| 4,181,390 | A | * | 1/1980 | Aizawa ...................... 439/375 |
| 4,365,396 | A | * | 12/1982 | Baba et al. .................. 445/22 |
| 4,644,452 | A | * | 2/1987 | Kasboske .................. 362/214 |
| 4,758,181 | A | * | 7/1988 | Reedy ........................ 439/546 |
| 4,883,434 | A | * | 11/1989 | Toyoshima ................. 439/619 |
| 4,894,027 | A | * | 1/1990 | Brantingham et al. ... 439/699.2 |
| 4,902,251 | A | * | 2/1990 | Grzena .................... 439/699.2 |
| 4,959,761 | A | * | 9/1990 | Critelli et al. .............. 362/226 |
| 4,968,270 | A | * | 11/1990 | Colleran et al. ......... 439/699.2 |
| 5,008,588 | A | * | 4/1991 | Nakahara ................ 313/318.1 |
| 5,080,615 | A | * | 1/1992 | Kondo ..................... 439/699.2 |
| 5,222,803 | A | * | 6/1993 | Kraus ......................... 362/226 |
| 5,368,503 | A | * | 11/1994 | Savage, Jr. ................. 439/502 |
| 5,427,532 | A | * | 6/1995 | Owen et al. ................. 439/57 |
| 5,558,543 | A | * | 9/1996 | Takano et al. ........... 439/699.2 |
| 5,578,893 | A | * | 11/1996 | Yamamoto ................. 313/112 |
| 5,630,729 | A | * | 5/1997 | Francis ....................... 439/548 |
| 5,634,823 | A | * | 6/1997 | Furuta et al. ............ 439/699.2 |
| 5,709,571 | A | * | 1/1998 | Briski et al. ............. 439/699.2 |
| 5,847,512 | A | * | 12/1998 | Baba et al. .................. 315/51 |
| 6,120,312 | A | * | 9/2000 | Shu ............................ 439/356 |
| 6,152,568 | A | * | 11/2000 | Baba et al. ................... 362/23 |
| 6,406,173 | B1 | * | 6/2002 | Serizawa et al. .......... 362/545 |

(Continued)

FOREIGN PATENT DOCUMENTS

JP 04-026087 * 1/1992

(Continued)

*Primary Examiner*—Stephen Husar
*Assistant Examiner*—Jason Han
(74) *Attorney, Agent, or Firm*—McGinn IP Law Group, PLLC

(57) ABSTRACT

An LED lamp has: an LED with a pair of terminals; a holder to which the LED is attached, the holder being of insulating material; and a radiation unit that has two metallic radiation plates that are attached to the holder while surrounding the holder and being insulated from each other. Each of the radiation plates has a contact portion that contacts the pair of terminals of the LED being attached to the holder and a power receiving terminals for power supplied to the LED.

9 Claims, 7 Drawing Sheets

U.S. PATENT DOCUMENTS

| | | | |
|---|---|---|---|
| 6,570,308 B1 * | 5/2003 | Helbig et al. | 313/318.09 |
| 2003/0058658 A1 * | 3/2003 | Lee | 362/555 |
| 2003/0142508 A1 * | 7/2003 | Lee | 362/555 |

FOREIGN PATENT DOCUMENTS

| | | | |
|---|---|---|---|
| JP | 2001-110210 | * | 4/2001 |

* cited by examiner

LED LAMP

The present application is based on Japanese patent application No. 2002-349285, the entire contents of which are incorporated herein by reference.

BACKGROUND OF THE INVENTION

1. Field of the Invention

This invention relates to an LED lamp that needs a means for radiating heat to be generated in operation.

2. Description of the Related Art

For example, automobiles are equipped with various lamps such as head lamp, tail lamp, winker lamp and stop lamp. These lamps use a lamp of several watts to tens of watts according to use, and an electric light bulb (hereinafter referred to as bulb) is conventionally used for them. The conventional various lamps are attached in a socket to facilitate the attaching and releasing, and its light section where the lamp is attached has a reflector to converge light in a desired direction.

"Since automobile bulbs are changeable parts, they have a structure to be fitted to a socket. Further, in order to shorten the time required in an attaching step of manufacturing, they are not screw type but insert type. For example, a bulb base section has a convex insert portion to a socket and two electrodes are disposed along both sides of the insert portion. The socket attached to the reflector is provided with built-in contact electrodes to contact the electrodes and a bulb support opening to which the insert portion is fitted. Thus, the attaching or releasing of the bulb can be performed simply by inserting or pulling (see for example, Japanese patent application laid-open No.2001-110210, pages 2–3 and FIG. 2)."

"Some vehicles use an LED stop lamp that has a plurality of red LED lamps with high output, instead of a light bulb. The LED lamp has small and lightweight light emitting elements and, therefore, the socket is unnecessary and a transparent red front panel is further unnecessary. Thus, the entire lamp can be minimized and simplified in structure. Also, it has a long lifetime. Accordingly, it has an optimum lamp for automobiles."

In recent years, a blue LED with high output is developed other than conventional red LED. Also, a white LED is developed based on the blue LED and some applications thereof begin instead of the conventional bulb. The white LED has a lower power consumption and longer lifetime than bulb. If the price lowers in the future, the white LED will be rapidly popularized.

Commercially available lighting apparatuses (flashlight, key holder etc.) using LED are generally structured such that LED leads are directly soldered to pattern or terminal of printed circuit board and therefore its LED lamp cannot be changed. Furthermore, the soldering is difficult to incorporate in the manufacturing line of automobile lamp and the manufacturing process is complicated thereby. So, it is desired that the LED lamp has such a structure that can be inserted to socket without soldering, like bulb. If so, the LED lamp can be handled as change parts, like bulb.

However, the conventional LED lamp of high output type (high brightness type) with consumption power of several watts to ten or more watts generates substantial amount of heat due to increased current. Especially in tail lamp and winker lamp of automobile, the LED, socket and its peripherals may be overheated because such a lamp is subject to radiation of external light and is frequently placed in a space with bad ventilation and, as a result, heat cannot be sufficiently radiated. Therefore, the temperature of light emitting element will rise and the brightness will lower.

SUMMARY OF THE INVENTION

It is an object of the invention to provide an LED lamp that can offer a high radiation property even when using a high output light emitting element.

It is another object of the invention to provide an LED lamp that can be easily assembled.

According to the invention, an LED lamp comprises;

an LED with a pair of terminals;

a holder to which the LED is attached, the holder being of insulating material; and a radiation unit that comprises two metallic radiation plates that are attached to the holder while surrounding the holder and being insulated from each other, each of the radiation plates including a contact portion that contacts the pair of terminals of the LED being attached to the holder and a power receiving terminals for power supplied to the LED.

In the above structure, where the radiation unit is composed of two radiation plates attached on both sides of the holder, the contact portion contacts the terminal of LED attached to the holder and heat generated from LED in operation is conducted to each radiation plate, thereby the radiation is performed. Thus, the overheating of LED can be prevented. Furthermore, the manufacturing process can be simplified because the LED lamp of the invention has such a structure that can facilitate the assembling.

It is preferable that each of the radiation plates is formed approximately C-shaped and has a fitted portion on its one end and the contact portion on its other end, and the holder has a pair of grooves on its both sides, one of the pair of grooves receiving the fitted portion and the other receiving the contact portion. Thereby, the radiation plate can be easily fixed to the holder.

It is preferable that the contact portion is processed to have a springy force. Thereby, the electrical connection with the pair of terminals of LED can be secured and therefore the loose connection due to disturbance such as vibration or thermal expansion can be prevented.

It is preferable that each of the radiation plates has an aperture in the side surface, and the holder has a protrusion to be engaged to the aperture in attaching the radiation plate to the holder. Thereby, the fixation of radiation plates to the holder can be secured.

It is preferable that the holder has an attachment section for attaching the holder to other member on its one end at which the LED is attached. Thereby, the positioning and attaching to the other member can be conducted simultaneously.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
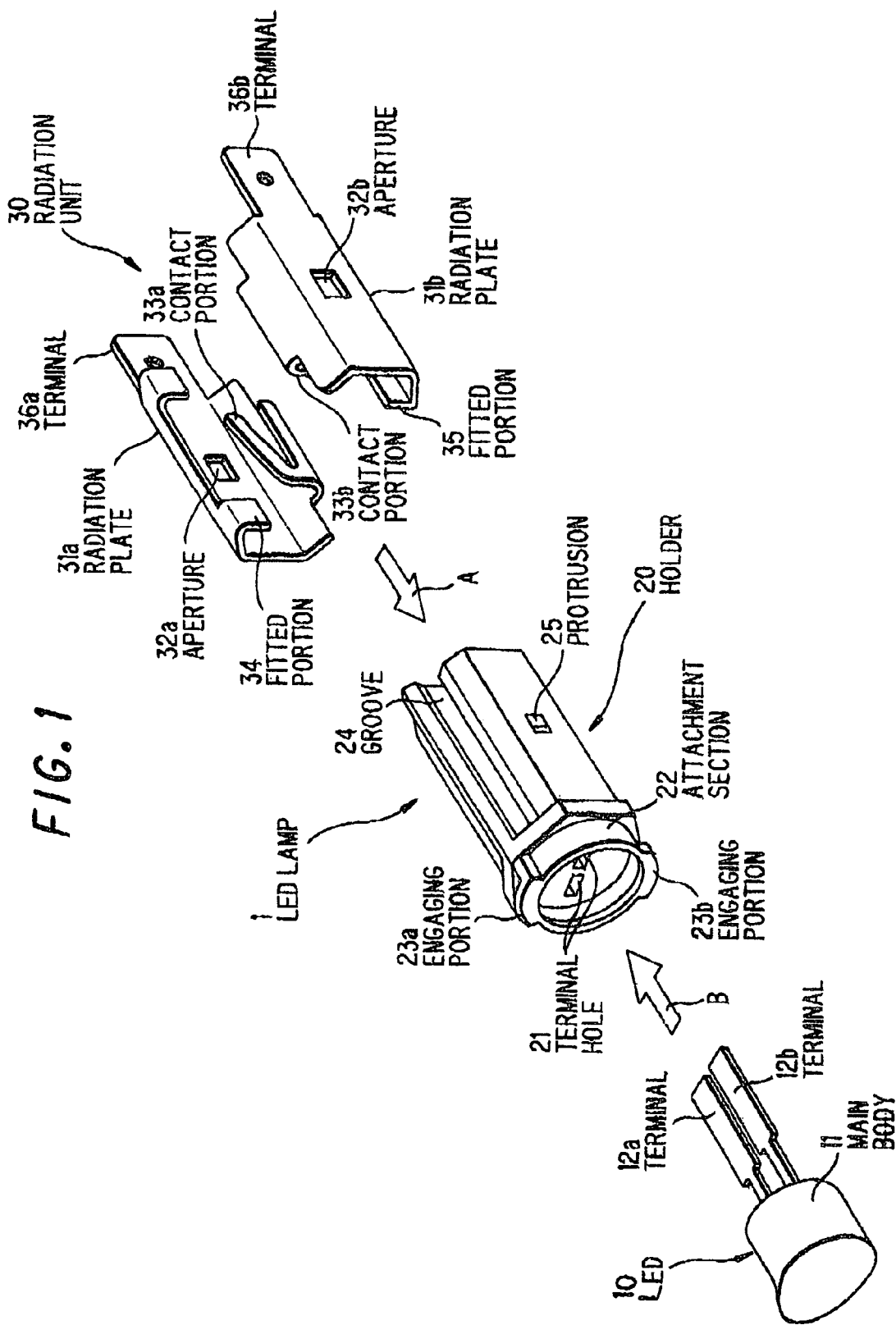
FIG. 1 is a perspective view showing a broken LED lamp in a first preferred embodiment according to the invention.
Figure 2:
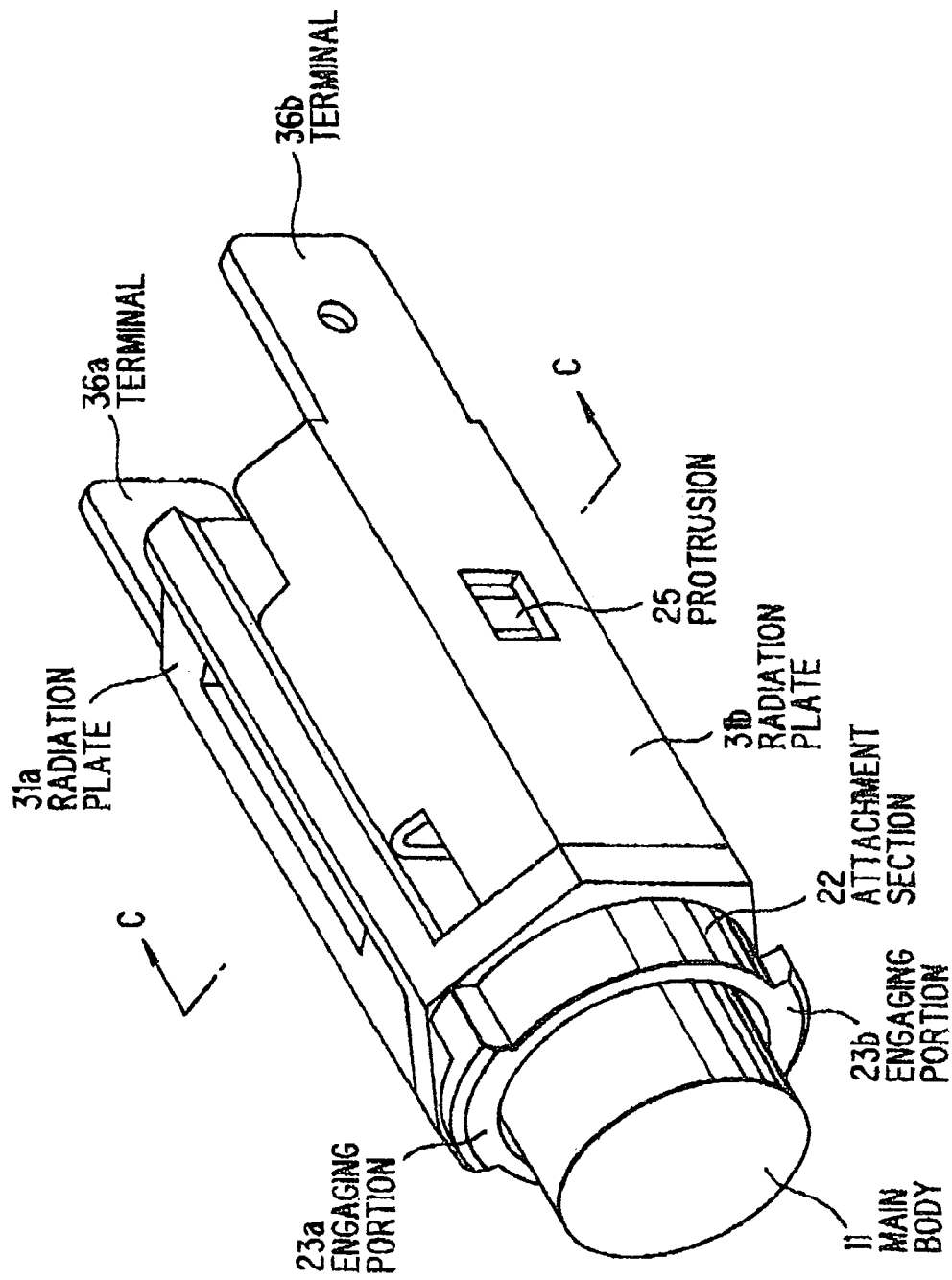
FIG. 2 is a perspective view showing an assembled LED in FIG.1.

FIG. 1 is a perspective view showing a broken LED lamp in the first preferred embodiment according to the invention. FIG. 2 is a perspective view showing the assembled LED in FIG. 1

LED lamp 1 is composed of LED 10 including a light emitting element (not shown), a holder 20 of insulating resin in which the LED 10 is housed, and a radiation unit 30 that is attached on both sides of the holder 20. The radiation unit 30 is composed of a pair of radiation plates 31a, 31b that are, as shown in FIG. 2, attached on the right and left sides of the holder 20.

LED 10 is composed of a tubular main body 11 and terminals 12a, 12b extending behind the main body 11. The main body 11 has a transparent front face from which light is emitted when supplying power between the terminals 12a, 12b. The terminals 12a, 12b of LED 10 are inserted to the holder 20, as shown by arrow in FIG. 1.

The holder 20 is made by molding the insulating resin, and it is desirable that the insulating resin has heat resistance. The holder 20 is composed of: terminal holes 21 into which the terminals 12a, 12b are inserted in the direction of arrow A in FIG. 1; a cylindrical attachment section 22 that is fitted and engaged to the center of a reflector 50 described later; engaging portions 23a, 23b that are disposed opposite to each other on the attachment section 22 and engaged to the reflector 50 to fix the holder 20; upper and lower grooves 24 that are formed on both sides of the holder 20 to receive the radiation plates 31a, 31b; and protrusions 25 that prevent the disengaging of radiation plates 31a, 31b.

The radiation plates 31a, 31b of radiation unit 30 are inserted to the holder 20 in the direction of arrow A in FIG. 1. The radiation plates 31a, 31b each are shaped such that its upper and lower portions are folded to offer an around C-shaped section in the front portion to middle portion and a plate-shaped section in the back portion. The radiation plates 31a, 31b are preferably of metal with good radiation and conductivity properties such as copper and copper alloy, and it is desirable that they have Au or Ag plating on the surface to avoid corrosion. The radiation plates 31a, 31b have apertures 32a, 32b, to which the protrusions 25 of holder 20 are engaged, on its both sides in the middle portion. Furthermore, the radiation plates 31a, 31b have contact portions 33a, 33b, which are formed parallel to the side and contact the terminals 12a, 12b being inserted to the holder 20, on one end in the middle portion.

The contact portions 33a, 33b are slightly bent upward and downward, respectively, such that they bring a certain springy force to the terminals 12a, 12b to secure the contact with the terminals 12a, 12b The contact portions 33a, 33b have a length about equal to the terminals 12a, 12b such that a sufficient contact area can be obtained. The radiation plates 31a, 31b have a pair of fitted portions 34, 35, which slide while being fitted in the grooves 24, on the other end in the middle portion. The radiation plates 31a, 31b has terminals 36a, 36b in the back portion.

With the above structure, the radiation plates 31a, 31b can be easily attached to the holder 20. Moreover, it is not necessary to fix the radiation plates 31a, 31b with screws since they do not disengage from the holder 20 when the protrusions 25 are engaged to the apertures 32a, 32b. Thus, the assembling becomes easy and the productivity can be thereby improved.

Figure 3:
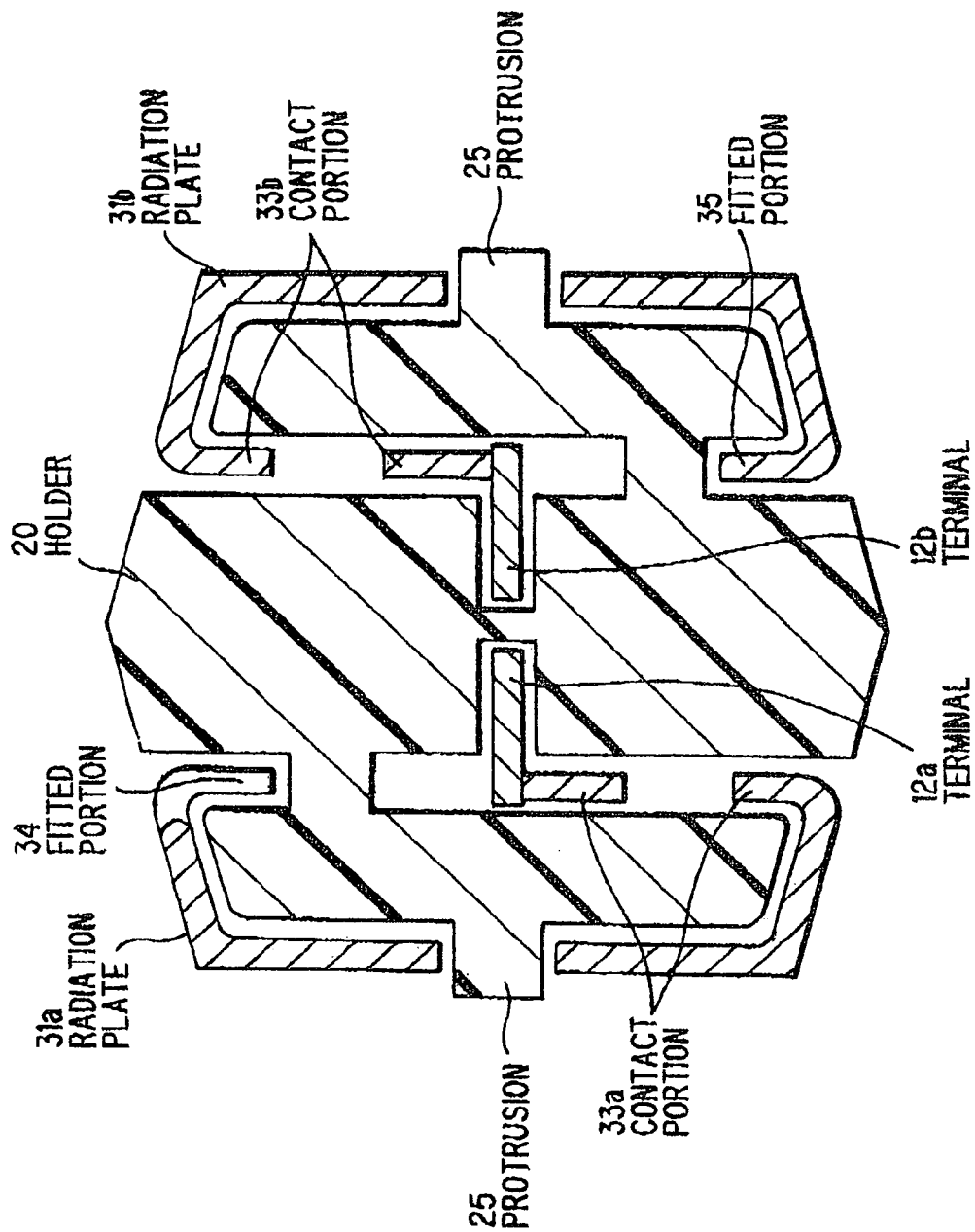
FIG. 3 is a cross sectional view cut along the line C—C in FIG. 2.

FIG. 3 is a cross sectional view cut along the line C—C in FIG. 2.

When the radiation unit 30 is attached to the holder 20 and LED 10 is inserted thereto, the terminal 12a of LED 10 contact the contact portion 33a of radiation plate 31a while having a springy force and the terminal 12b of LED 10 contact the contact portion 33b of radiation plate 31b while having a springy force. Then, when a predetermined DC voltage is applied between the terminals 36a and 36b, the voltage is applied through the terminals 36a, 36b and the contact portions 33a, 33b to the terminals 12a, 12b. Thereby, LED 10 emits light, When the LED 10 radiates heat during the operation, heat is conducted to the terminals 12a, 12b. Then, heat is conducted to the contact portions 33a, 33b being contacted with the terminals 12a, 12b, then conducted the other portion of radiation plates 31a, 31b. At that time, the entire radiation plates 31a, 31b serve as a radiation member to radiate heat. Since the radiation plates 31a, 31b are provided on the outer surface of holder 20. the radiation can be performed efficiently.

Figure 4:
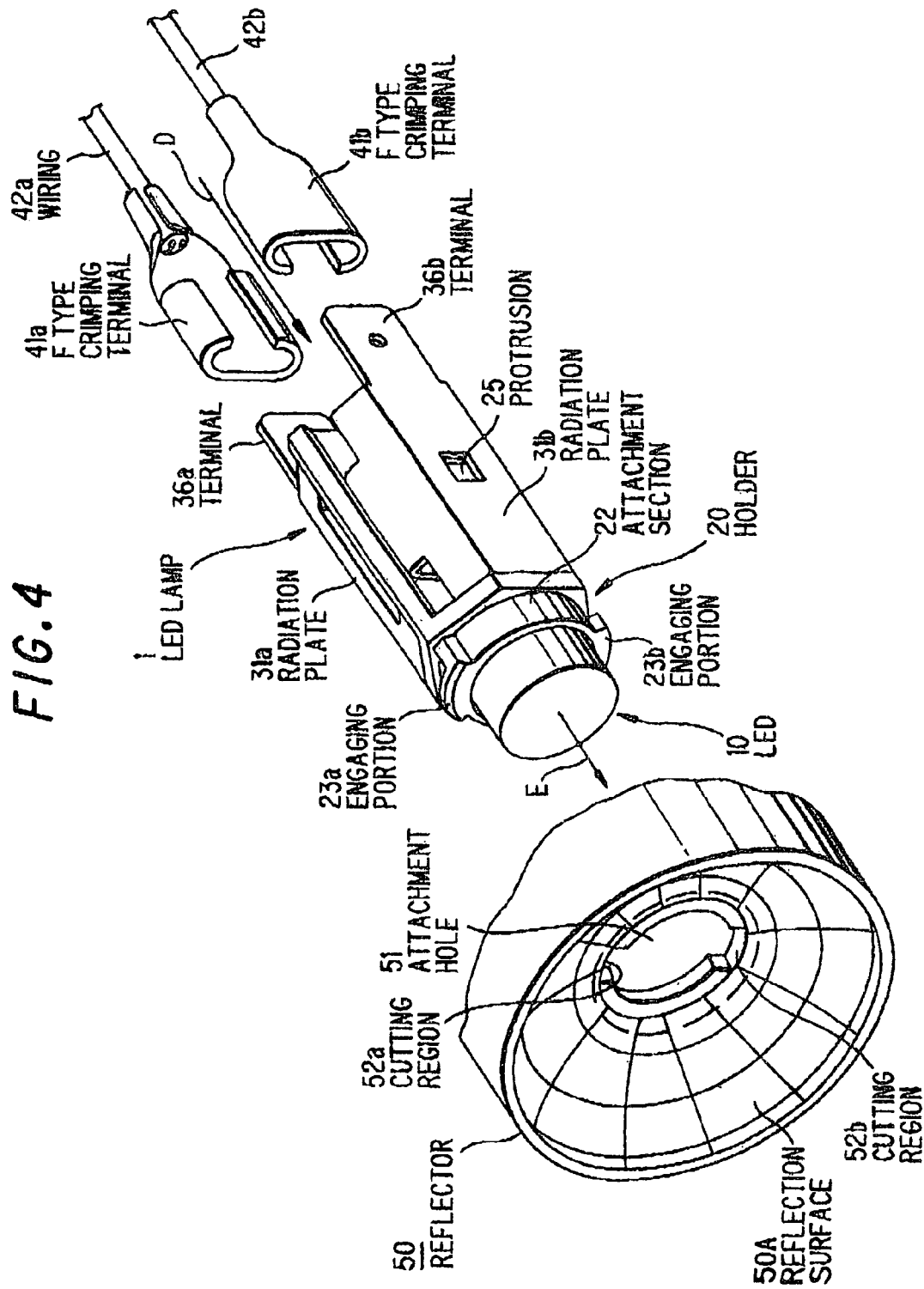
FIG. 4 is a perspective view showing a reflector 50 to which an LED lamp 1 of the first embodiment is attached.

FIG. 4 is a perspective view showing the reflector 50 to which the LED lamp 1 of the first embodiment is attached. The reflector 50 is composed of an attachment hole 51 that is located at the center of light reflection surface 50A, and cutting regions 52a, 52b that are engaged with the engaging portions 23a, 23b of LED lamp 1. The light reflection surface 50A is formed concave while having a plurality of reflection regions in order to converge light emitted from LED 10 to lamp the forward.

In assembling the LED lamp 1, at first, the radiation plates 31a, 31b are inserted, in the direction of arrow A in FIG. 1, from the back end of the holder 20 to the grooves 24 on both sides of the holder 20. When they are pushed until the protrusion 25 is engaged to the apertures 32a, 32b, the radiation plates 31a, 31b are fixed to the holder 20. Then, the terminals 12a, 12b are inserted to the terminal holes 21 in the direction of arrow B in FIG. 1 while matching the polarity of the terminals 12a, 12b to that of terminal holes 21 of holder 20 until the back face of LED 10 abut on the inner face of attachment section 22. Thus, the LED lamp 1 shown in FIG. 2 is assembled.

Then, to the terminals 36a, 36b of the assembled LED lamp 1 in FIG. 2, P type crimping terminals 41a, 41b are inserted in the direction of arrow D in FIG. 4. Thereby, the terminals 36a, 36b are connected with the F type crimping terminals 41a, 41b, respectively. The F type crimping terminals 41a, 41b have wires 42a, 42b which are connected with a wire harness (not shown) and ends of which are crimped. Then, from the back of reflector 50, the top of LED 10 is inserted to the attachment hole 51 in the direction of arrow E while matching the engaging portions 23a, 23b of holder 20 to the cutting regions 52a, 52b of reflector 50. After inserting the attachment section 32 of holder 20 to the attachment hole 51, the holder 20 is rotated in a predetermined direction and, thereby, the engaging portions 23a, 23b are engaged to the reflector 50. Thus, the disengaging of LED lamp 1 can be prevented.

In the first embodiment described above, with the radiation unit 30 attached on the holder 20 to hold LED 10, heat generated during the operation of LED 10 can be radiated such that the LED lamp 1 operates stably without reducing the emission efficiency of LED due to such heating. The radiation plates 31a, 31b are integrally attached to the holder 20 while also serving as the electrical connection portions to the F type crimping terminals 41a, 41b. Therefore, the LED lamp 1 can offer a sufficient radiation area without increasing the size of holder 20.

Furthermore, the LED lamp 1 is fixed to the reflector 50 by means of the engagement between the engaging portions 23a, 23b of holder 20 and the cutting regions 52a, 52b of reflector 50. Thus, the LED lamp 1 can be easily and securely fixed thereto simply by inserting the LED lamp 1 to the attachment hole 51 and then rotating it. Simultaneously, the LED 10 can be accurately positioned to the light reflection surface 50A.

Although in the first embodiment the terminals 12a, 12b are disposed to contact the contact portions 33a, 33b orthogonally to each other as shown in FIGS. 1 and 3, the contact portions 33a, 33b may be bent 90 degrees such that the terminals 12a, 12b contact the contact portions 33a, 33b while being stacked in parallel. In this case, since the contact area further increases the radiation property can be enhanced.

Alternatively, the other radiation member may be additionally attached to or laid in contact with the radiation plates 31a, 31b. Also in this case, since the contact area further increases, the radiation property can be enhanced.

Further, in FIGS. 1 to 4, the fitted portions 34, 35 and the contact portions 33a, 33b may be disposed reversely. Also, though the radiation plates 31a, 31b are attached to the right and left sides of holder 20, they may be attached to the top and bottom sides of holder 20.

Figure 5:
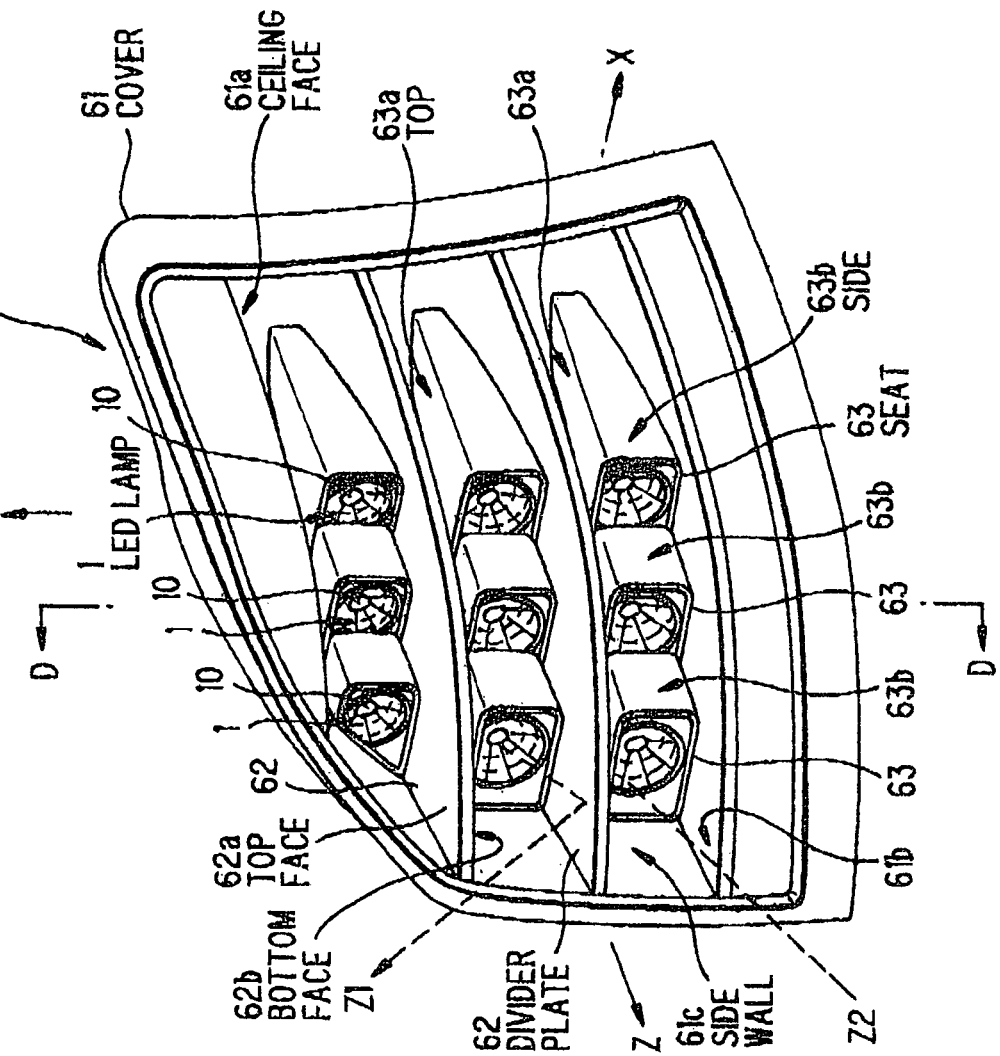
FIG. 5 is a perspective view showing a schematic composition of vehicle combination lamp in a second preferred embodiment according to the invention.

FIG. 5 is a perspective view showing the schematic composition of vehicle combination lamp in the second preferred embodiment according to the invention.

The combination lamp 60 has an opening that extends from the front face in the direction of arrow Z to the side face in the direction of arrow X. In cover 61 with an inside space, two divider plates 62 to horizontally divide the space into three stages with equal intervals are disposed. On each stage, three seats 63 are arranged laterally. Each seat 63 has LED lamp 1 attached on the front face. Aluminum deposition is made to ceiling face 61a, bottom face 61ba and side wall 61c inside the cover 61, to top face 62a and bottom face 62b of the divider plate 62, and to top 63a and side 63b of the seat 63. In other words, aluminum deposition is made to entire interior of cover 61.

Figure 6:
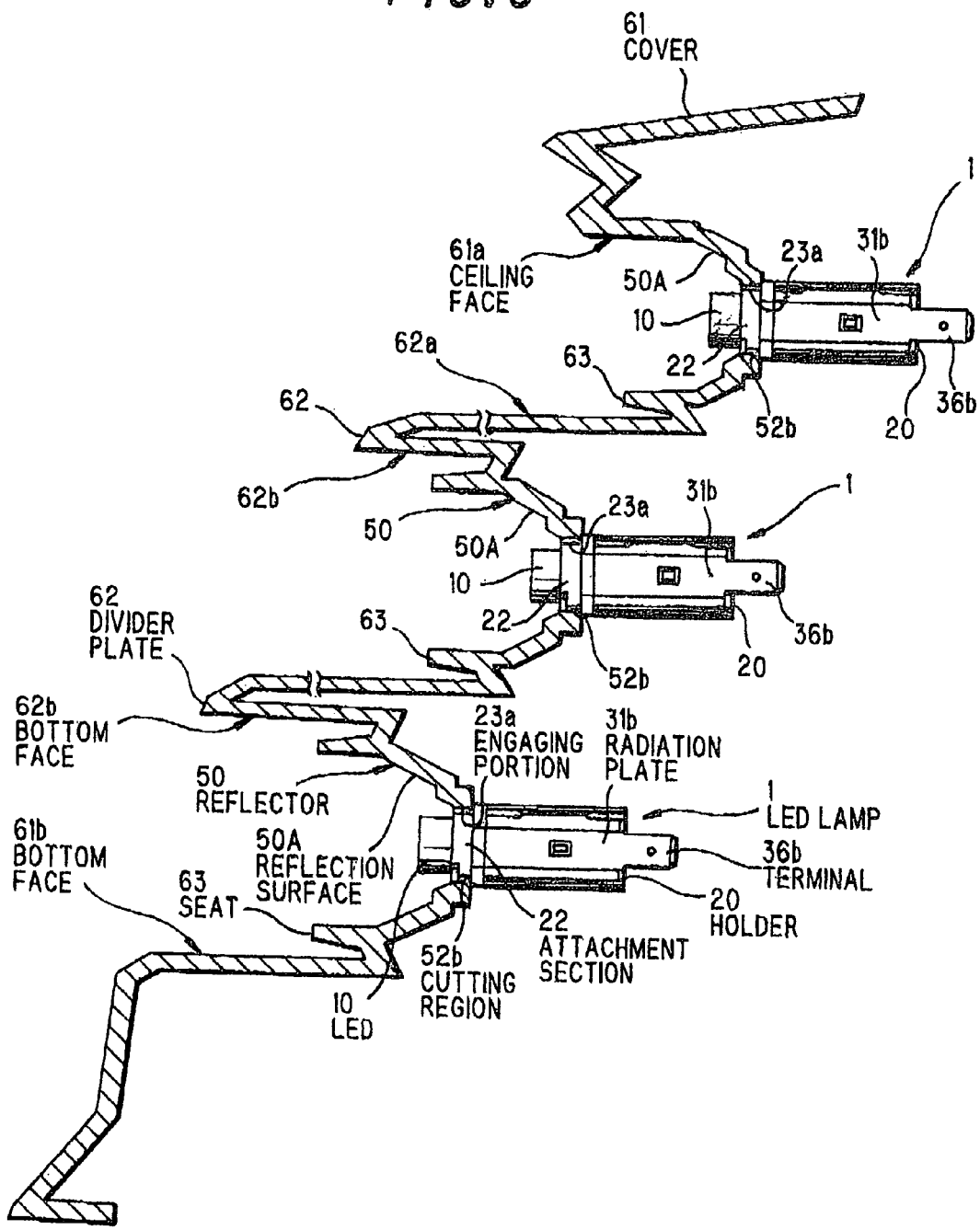
FIG. 6 is a vertical sectional view cut along the line D—D in FIG. 5.

FIG. 6 is a vertical sectional view cut along the line D—D in FIG. 5. As shown in FIG. 6, the combination lamp 60 is structured combining the LED lamps 1 and reflectors 50. The LED lamp 1 is attached to the reflector 50 by engaging the engaging portions 23a, 23b of holder 20 to the cutting regions 52a, 52b.

In the second embodiment, as earlier described in the first embodiment, the LED lamp 1 is attached to the reflector 50 by engaging the engaging portions 23a, 23b of holder 20 to the cutting regions 52a, 52b. Therefore, in assembling, the LED lamp 1 can be easily and accurately positioned to the reflector 50. In the combination lamp 60 with a plurality of LED lamps 1 thus attached, each LED lamp 1 can be easily changed when it does not turn on normally Thus, the entire combination lamp 60 is not needed to be wastefully changed in such a case.

Figure 7:
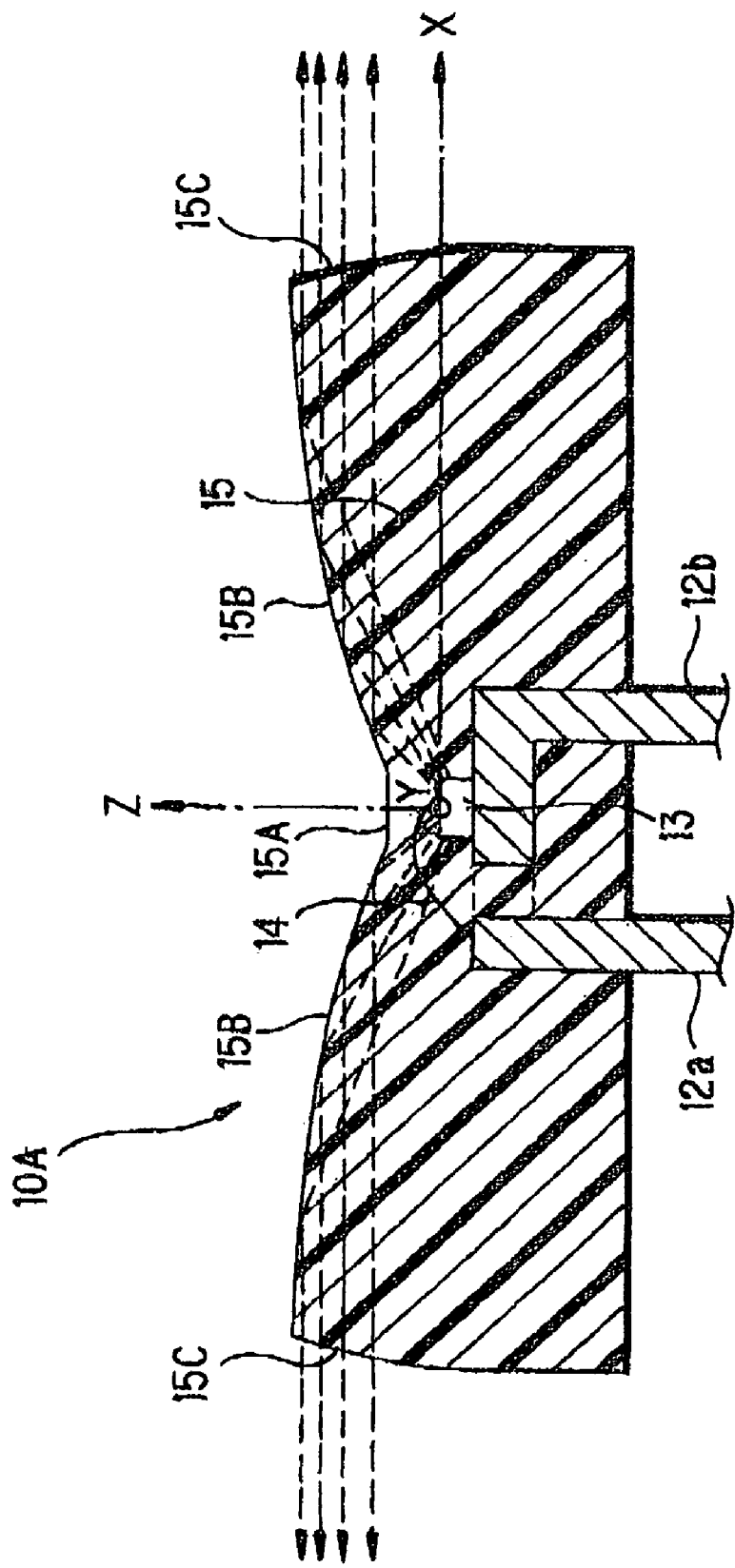
FIG. 7 is a vertical sectional view showing a lateral emission type LED in a third preferred embodiment according to the invention.

FIG. 7 is a vertical sectional view showing a lateral emission type LED in the third preferred embodiment according to the invention.

LED 10A is composed of: a pair of lead frames 12a, 12b that are disposed via a space for insulation on the X-Y plane; a light emitting element 13 that is mounted at X-Y coordinate origin on the lead frame 12a which is formed L-shaped by bending a metal strip plate; a bonding wire 14 to electrically connect the upper electrode of light emitting element 13 with the end of lead frame 12a; and transparent epoxy resin 15, which has flat and cylindrical form, to seal the lead frames 12a, 12b, light emitting element 13 and bonding wire 14.

The transparent epoxy resin 15 has flat portion 15A located just over the light emitting element 13, reflection surface 15B formed in arc shape connecting with the flat portion 15A, and side reflection surface 15C.

The reflection surface 15B is in the form of umbrella by rotating part of a parabola, which has a focal point corresponding to the center of emission surface of the light emitting element 13 and a symmetrical axis in the X-axis direction, around Z-axis in the range of more than 60 degrees from the coordinate origin to the Z-axis.

With LED 10A thus structured, emission light can be efficiently taken out in the direction of perpendicular to the center axis of light emitting element. Thereby, when LED 10A attached to the holder 20 is fixed to the reflector 50, light emitted to the side direction can be reflected on the reflector 50, then radiated uniformly in a wide range. As a result, the visibility of LED lamp 1 can be enhanced.

Although, in the above explanation, the led lamp of the invention is applied to vehicle lamp, it is not limited to that use and can be applied to all led lamps that may generate some heat.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. An LED lamp, comprising:
an LED comprising a pair of terminals;
a holder to which the LED is attached, the holder comprising an insulating material; and
a radiation unit that comprises two metallic radiation plates that each surround at least three outer surfaces of the holder and are attached to the holder while being insulated from each other, each of the radiation plates comprising a contact portion that contacts the pair of terminals of the LED being attached to the holder and a power receiving terminal, wherein at least one of the radiation plates further comprises a fitted portion, and wherein the fitted portion and the contact portion are at an open end of the at least one radiation plate.

2. The LED lamp according to claim 1, wherein:
said at least one of the radiation plates comprises a C-shape that has the fitted portion on its one end at the open end and the contact portion on its other end at the open end, and
the holder comprises a pair of grooves on both sides, one of the pair of grooves receiving the fitted portion and the other receiving the contact portion.

3. The LED lamp according to claim 1, wherein:
the contact portion comprises a spring.

4. The LED lamp according to claim 1, wherein:
each of the metallic radiation plates comprises an aperture in a side surface, and
the holder comprises a protrusion to be engaged to the aperture in attaching the metallic radiation plate to the holder.

5. The LED lamp according to claim 1, wherein:
the holder comprises an attachment section for attaching the holder to another member on its one end at which the LED is attached.

6. The LED lamp according to claim 5, wherein:
the another member comprises a reflector to converge light.

7. The LED lamp according to claim 1, wherein:
the LED comprises a main lateral emission direction that is approximately perpendicular to the center axis of a light emitting element comprising the LED.

8. The LED lamp of claim 1, wherein at least one of said metallic radiation plates is for radiating heat away from the holder.

9. The LED lamp of claim 1, wherein a substantial portion of at least one of said two metallic radiation plates surrounds said respective side of said outer surface of said holder.

* * * * *